(12) United States Patent
Endoh et al.

(10) Patent No.: US 8,406,360 B2
(45) Date of Patent: Mar. 26, 2013

(54) SIGNAL GENERATING METHOD FOR CLOCK RECOVERY AND CLOCK RECOVERY CIRCUIT

(75) Inventors: Yasuyuki Endoh, Yokohama (JP); Kazuhito Takei, Yokohama (JP); Katuyoshi Miura, Yokohama (JP); Tadanobu Nikaido, Yokohama (JP); Yoshiaki Kisaka, Yokohama (JP)

(73) Assignee: NTT Electronics Corporation, Kanagawa (JP)

(*) Notice: Subject to any disclaimer, the term of this patent is extended or adjusted under 35 U.S.C. 154(b) by 296 days.

(21) Appl. No.: 12/992,443

(22) PCT Filed: Apr. 22, 2009

(86) PCT No.: PCT/JP2009/058016
§ 371 (c)(1),
(2), (4) Date: Nov. 12, 2010

(87) PCT Pub. No.: WO2009/145021
PCT Pub. Date: Dec. 3, 2009

(65) Prior Publication Data
US 2011/0063001 A1    Mar. 17, 2011

(30) Foreign Application Priority Data
May 30, 2008   (JP) ................................ 2008-143231

(51) Int. Cl.
*H04L 7/00*   (2006.01)
*H03D 3/24*   (2006.01)
*H04J 3/06*   (2006.01)

(52) U.S. Cl. .......................... 375/355; 375/376; 370/505

(58) Field of Classification Search .................. 375/354, 375/371, 316, 373–376, 359–366; 370/503, 370/505, 506, 509–514, 516; 327/141, 155–159
See application file for complete search history.

(56) References Cited

U.S. PATENT DOCUMENTS

| | | | | |
|---|---|---|---|---|
| 3,938,082 A | * | 2/1976 | Schowe, Jr. .................... | 714/798 |
| 5,185,736 A | * | 2/1993 | Tyrrell et al. .................. | 370/358 |

(Continued)

FOREIGN PATENT DOCUMENTS

| | | |
|---|---|---|
| JP | 2630058 | 4/1997 |
| JP | 2697371 | 9/1997 |

(Continued)

OTHER PUBLICATIONS

International Search Report dated Jul. 28, 2009 for corresponding International Patent Application No. PCT/JP2009/058016.

(Continued)

*Primary Examiner* — Tesfaldet Bocure
(74) *Attorney, Agent, or Firm* — Ohlandt, Greeley, Ruggiero, & Perle, L.L.P.

(57) ABSTRACT

According to the present invention, as shown in FIG. 5(a), when a signal for clock recovery ED is generated, which is formed by alternately generating enable periods EN having a ratio (N/M) of N clocks' client data to M clocks' line data and disable periods D1 to D4, a phase of the disable period D2 is advanced by a phase corresponding to the disable period (such as one clock period) during the enable period with reference to phase information added to the signal for clock recovery ED as shown in FIG. 5(c) when a stuff pulse in the line data is detected as indicated by the symbol m0 in FIG. 5(b), thereby generating the signal for clock recovery ED.

4 Claims, 6 Drawing Sheets

U.S. PATENT DOCUMENTS

| | | | | |
|---|---|---|---|---|
| 5,272,391 A | * | 12/1993 | Ampe et al. | 327/141 |
| 6,396,888 B1 | * | 5/2002 | Notani et al. | 375/364 |
| 2003/0076911 A1 | | 4/2003 | Kobayashi et al. | 375/372 |

FOREIGN PATENT DOCUMENTS

| | | |
|---|---|---|
| JP | 11-331117 | 11/1999 |
| JP | 3044853 | 3/2000 |
| JP | 2003-134076 | 5/2003 |
| JP | 3529713 | 3/2004 |
| JP | 2004-282632 | 10/2004 |
| JP | 2007-259118 | 10/2007 |

OTHER PUBLICATIONS

English translation of Written Opinion of the International Searching Authority dated Jul. 28, 2009 for corresponding International Patent Application No. PCT/JP2009/058016.

English translation of International Preliminary Report on Patentability dated Jan. 20, 2011 for corresponding International Patent Application No. PCT/JP2009/058016.

\* cited by examiner

SIGNAL GENERATING METHOD FOR CLOCK RECOVERY AND CLOCK RECOVERY CIRCUIT

TECHNICAL FIELD

The present invention relates to a signal generating method for clock recovery and a clock recovery circuit for generating a signal which is formed by alternately generating enable periods and disable periods necessary for clock recovery of a demapping processing of extracting client data in a processing for a high-speed transmission signal (such as OTU3:43 Gbps) which is framed in a multilayered manner and requires a stuff processing per layer in an optical transmission system.

BACKGROUND ART

At present, as described in Patent Document 1, for example, the optical transmission system employs a time division multiplexing system in which a plurality of low-speed digital signals are multiplexed in a time division manner to form one high-speed digital signal (which may be referred to as high-speed transmission signal) and the high-speed transmission signal is transmitted in an optical fiber in order to economically transmit the digital signal to a destination. Further, in the transmission of this type, framing is performed in multiple layers by multilayered frames and a stuff processing is performed per layer as follows as needed.

Each low-speed digital signal is multiplexed in a stuff multiplexing system or the like in order to multiplex a plurality of low-speed digital signals in a time division manner. In the stuff multiplexing system, the low-speed digital signal as client data at the transmission side is mapped in a frame form according to a clock signal having a predetermined frequency. During the mapping, there is performed a stuff processing of inserting a stuff pulse having no information component into each low-speed digital signal. There is performed a destuff processing of demapping the signal in the frame format the reception side to recover the client data and of removing the stuff pulse during the recovering.

When there is performed a demapping processing of extracting N clocks' client data in line data from the M clock's line data transmitted in a multilayered frame form, a clock signal is recovered from the line data and the client data in the line data is written in a buffer memory by the recovered clock signal. The written client data is read and recovered by an oscillation clock signal of an oscillator synchronized with the recovered clock signal. M and N for M clocks and N clocks are positive integers and have the relationship of N<M.

Figure 1:
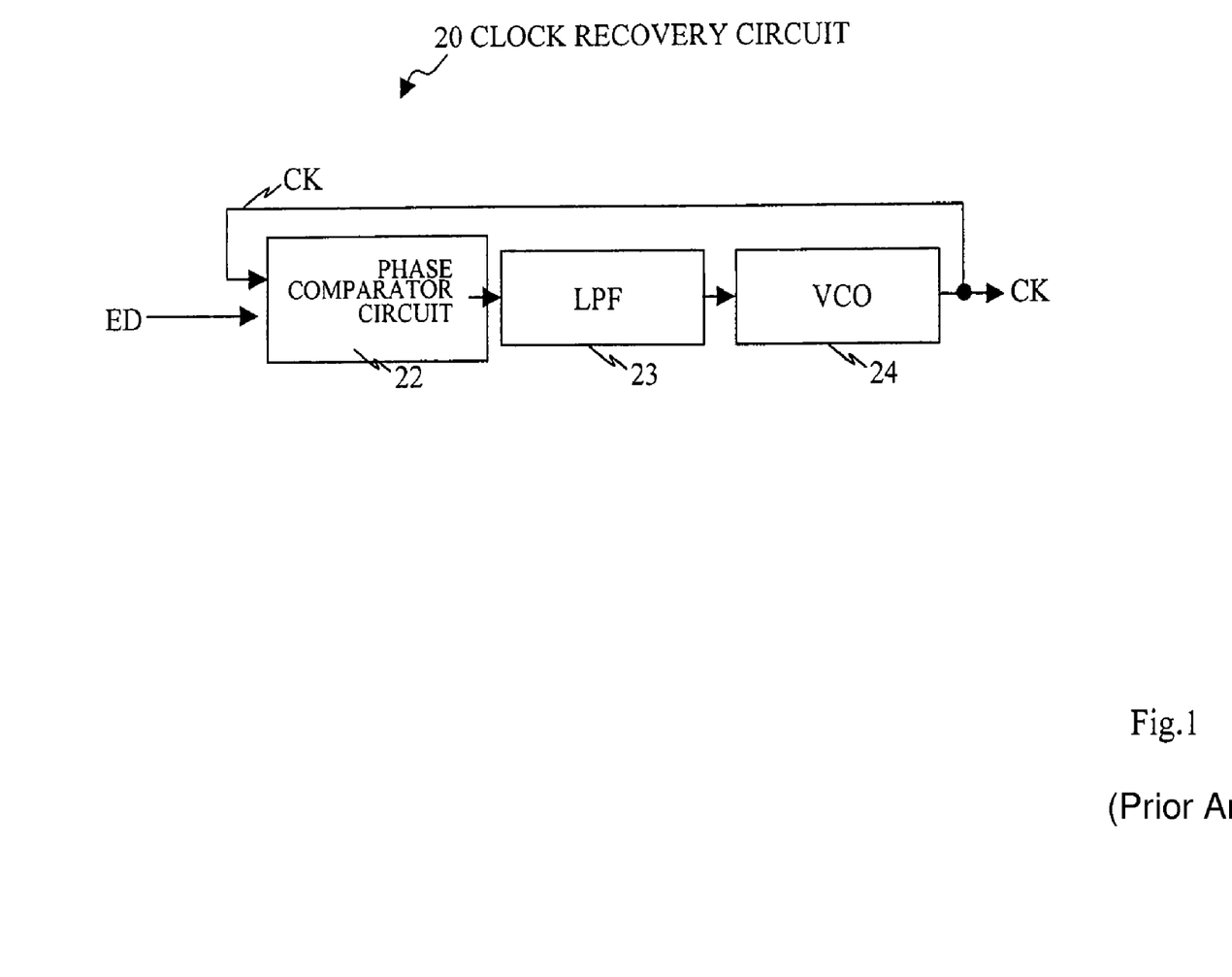
FIG. 1 is a block diagram showing a configuration of a clock recovery circuit using an enable period.

Further, when a clock signal is recovered from the line data during the demapping, a signal for clock recovery needs to be generated, which is formed by alternately generating enable periods having a ratio (N/M) of the N clock's client data to the M clock's line data, and disable periods. In FIG. 1, a signal for clock recovery ED is input into a clock recovery circuit 20, thereby obtaining a recovered clock signal CK.

The clock recovery circuit 20 is configured to include a phase comparator circuit 22 as phase synchronization loop circuit, a LPF (lowpass filter) 23 and a VCO (voltage control oscillator) 24. The signal for clock recovery ED is input into the phase comparator circuit 22 of the clock recovery circuit 20, the signal for clock recovery ED and the fed-back recovered clock signal CK are compared with each other for their phases in the phase comparator circuit 22, and a differential signal obtained from the comparison result is output to the LPF 23.

Further, a voltage signal obtained by filtering the differential signal in the LPF 23 is supplied to the VCO 24 and the recovered clock signal CK having a frequency according to the voltage supply is output. The N clocks' client data in the M clocks' line data is written in the buffer memory by the recovered clock signal CK. Furthermore, the client data written in the buffer memory is read and recovered by the oscillation clock signal of the oscillator synchronized with the recovered clock signal CK.

When the demapping processing is performed in this manner, if a stuff pulse is inserted in the line data, the destuff processing is also performed. In the destuff processing, during the destuff detection for detecting a stuff pulse inserted in the multilayered line data, in order to remove the stuff pulse, that is, in order to prevent the stuff pulse from being written in the buffer memory, a disable period is added to the signal for clock recovery ED.

Figure 2:
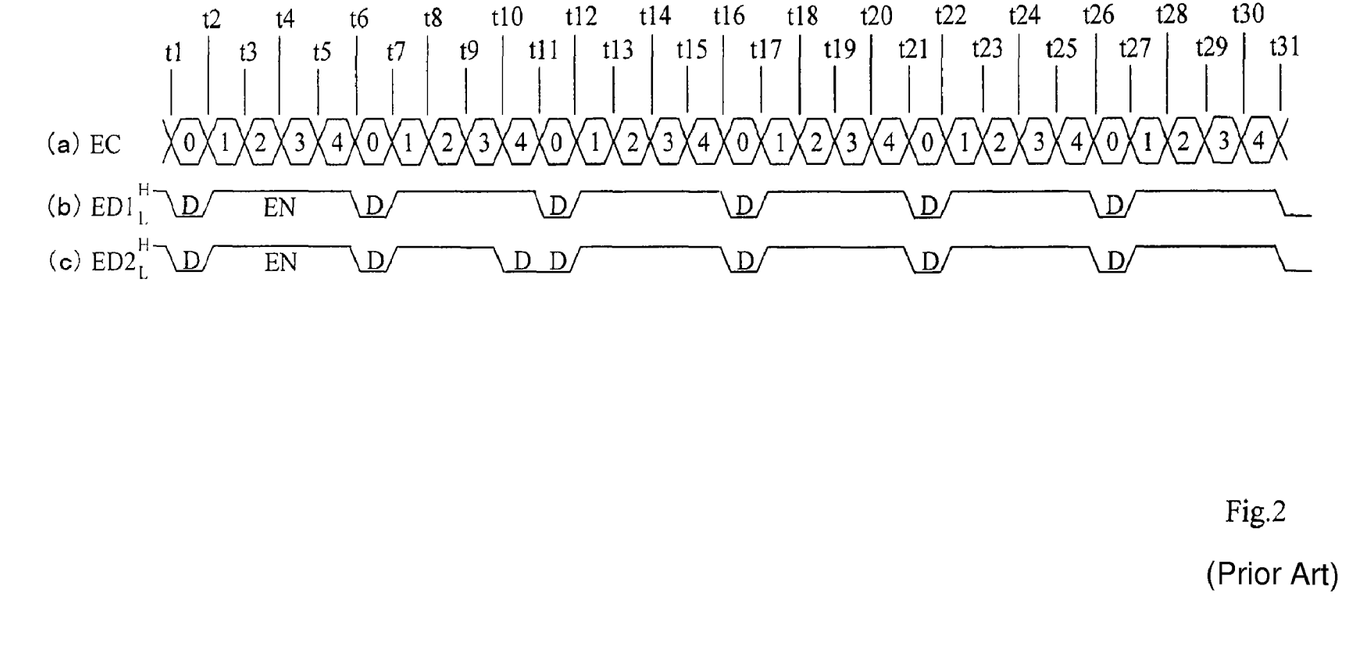
FIG. 2 is a first timing chart showing a generation state of a signal for clock recovery which is formed by alternately generating enable periods and disable periods by a conventional signal generating method for clock recovery, where

The adding processing will be described with reference to a timing chart shown in FIG. 2. FIG. 2(a) shows an enable generation cycle EC in which one cycle is sequentially repeated at a cycle timing value of "0, 1, 2, 3, 4", FIG. 2(b) shows a signal for clock recovery ED1 which is formed by alternately generating the enable periods EN and the disable periods D when a stuff pulse is not detected in the destuff processing, and FIG. 2(c) shows a signal for clock recovery ED2 which is formed by alternately generating the enable periods EN and the disable periods D when a stuff pulse is detected in the destuff processing. The cycle timing corresponds to one clock reproduced from the line data.

In other words, when a stuff pulse is not detected, as shown in FIG. 2(b), there is generated the disable period D having the "L" level for one clock with the cycle timing value of "0" per five clocks (which will be abbreviated to "L"), and there is generated the enable period EN having the "H" level for four clocks with other cycle timing value of "1, 2, 3, 4" (which will be abbreviated to "H").

On the other hand, as shown in FIG. 2(c), when a stuff pulse is detected, the stuff pulse is detected at time t10, for example, and the disable period D is generated and added at the cycle timing of "4" for one clock between time t10 and t11.

Figure 3:
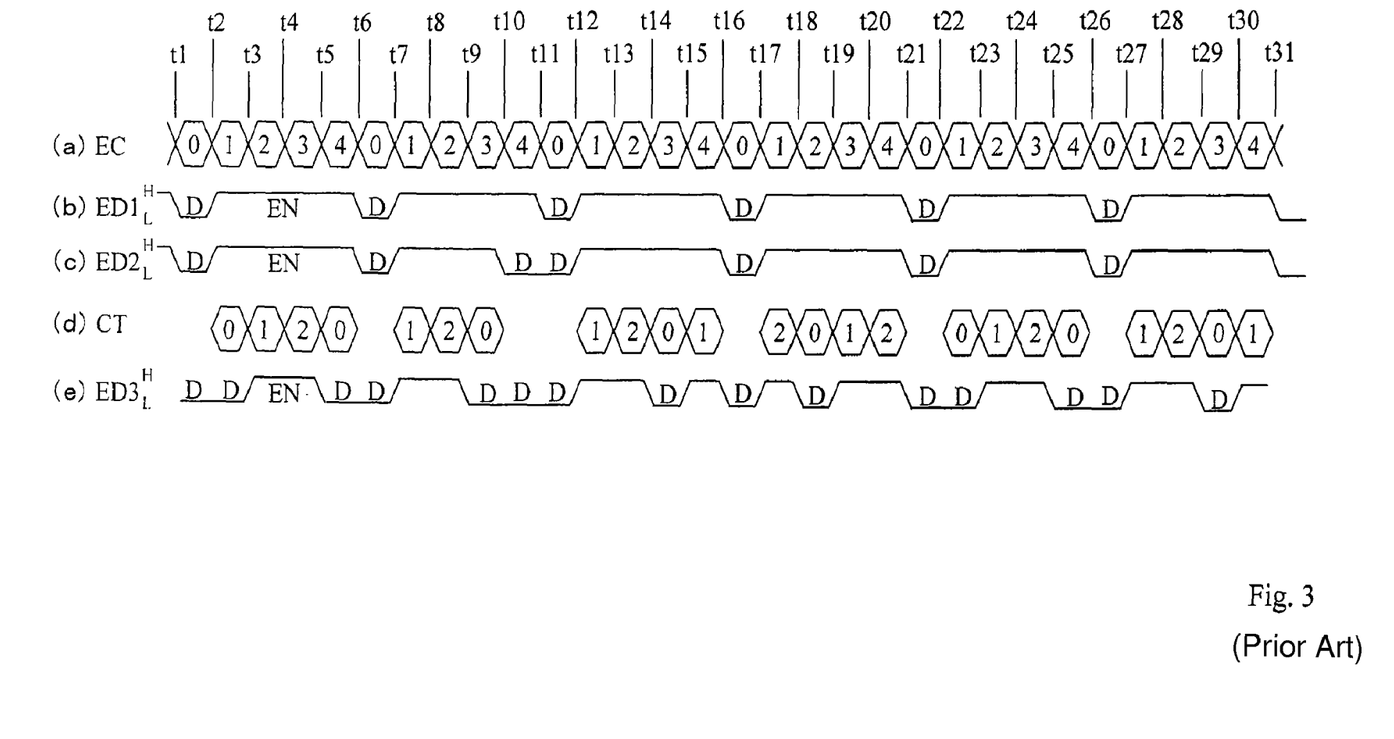
FIG. 3 is a second timing chart showing a generation state of a signal for clock recovery which is formed by alternately generating enable periods and disable periods by the conventional signal generating method for clock recovery, where

In the case of the multilayered frame, a frequency dividing counter (not shown) is used to cause the frequency dividing counter to count such that a count value CT is repeated in the order of "0, 1, 2" as shown in FIG. 3(d) when the cycle timing value of the enable generation cycle EC in FIG. 3(a) is "1, 2, 3, 4" and the signal for clock recovery ED2 in FIG. 3(c) is at "H". When the count value CT is at "1, 2", the enable period EN is generated to be "H" as shown in FIG. 3(e) and thereby a signal for clock recovery ED3 is generated.

PATENT DOCUMENT

Patent Document 1 Patent 3529713 Publication

DISCLOSURE OF THE INVENTION

Problems to be Solved by the Invention

As stated above, when the disable period D is added like the signal for clock recovery ED2 shown in FIG. 2(c), the "L" disable period D is overwritten and added in the "H" generation period of the enable period EN as indicated at time t10 to t11. Thus, a length of the generation period of the enable period EN is three clocks as indicated at time t7 to t10 and a length of the disable period D is two clocks as indicated at time t10 to t11. Thus, there is a problem that an output cycle of the enable period EN is deviated and consequently a large jitter occurs in the recovered clock signal CK.

Further, in the case of the multilayered frame, like the clock signal for clock recovery ED3 shown in FIG. 3(e), in the method for generating the enable period EN, the length of the generation period of the enable period EN is two clocks at time t3 to t5 or one clock at time t15 to t16 and the length of the disable period D is one clock at time t14 to t15, two clocks at time t5 to t7 or three clocks at time t9 to t12, which lead to a variation in the length as compared with the above case. Thus, there is a problem that the deviation of the output cycle of the enable period EN is further deteriorated and a larger jitter occurs in the recovered clock signal CK.

In order to solve the problems, it is an object of the present invention to reduce jitters occurring in a recovered clock signal by eliminating a deviation of an output cycle of an enable period when generating a signal for clock recovery formed by alternately generating enable periods having a ratio (N/M) of N clocks' client data to M clock's line data and disable periods.

Means for Solving the Problems

In order to achieve the object, there is provided a signal generating method for clock recovery in which in order to recover a clock signal for extracting the second data of N clocks' (N: positive integer, N<M) in first data from the first data of M clocks' (M: positive integer), a signal for clock recovery which is formed by alternately generating enable periods having a ratio (N/M) of the second data to the first data and disable periods is generated, and when specific data to be previously inserted in the first data is detected from the first data during the enable period, a disable period is added during the enable period. The processing of adding a disable period during the enable period does not actually add the disable period, but advances and generates a phase of the disable period to be generated after specific data is detected by a predetermined phase.

Specifically, there is provided a signal generating method for clock recovery for, in order to recover a clock signal for extracting the second data of N clocks' (N: positive integer, N<M) in first data from the first data of M clocks' (M: positive integer), generating a signal for clock recovery which is formed by alternately generating enable periods having a ratio (N/M) of the second data to the first data and disable periods, and for, when a stuff pulse to be previously inserted in the first data is detected from the first data during the enable period, adding a disable period during the enable periods, wherein phases of the enable period and the disable period are presented to the signal for clock recovery, phase information corresponding to a clock signal included in the first data is provided thereto, the processing of adding the disable period during the enable period finds a phase corresponding to the disable period during the enable period based on the phase information when the stuff pulse specific data is detected, and a phase of the disable period to be generated after the stuff pulse specific data is detected is advanced by the found phase.

According to the method, when a signal for clock recovery is generated which is formed by alternately generating enable periods having a ratio (N/M) of the second data of N clocks' to the first data of M clocks' and disable periods, a deviation of an output cycle of the enable period can be reduced. Thus, jitters occurring in the recovered clock signal generated using the enable period can be reduced.

The signal generating method for clock recovery according to the present invention desirably finds, when the multiple items of stuff pulses are detected during the enable period, a phase corresponding to the disable period during the enable period based on the phase information whenever each item of stuff pulses is detected, and advances a phase of one disable period among the disable periods sequentially generated after the specific data is detected by the found phase.

According to the method, even when multiple items of stuff pulses are inserted in one cycle of generating period for the enable period, the deviation of the output cycle of the enable period can be eliminated, thereby reducing jitters occurring in the recovered clock signal CK.

Specifically, there is provided a clock recovery circuit including a phase synchronization loop circuit for using a signal for clock recovery alternately having the enable periods and the disable periods, which is generated by the signal generating method for clock recovery according to the first or second aspect, as a phase comparison target for a phase synchronization loop processing to oscillate a clock signal, and using the oscillated clock signal as a phase comparison target for the signal for clock recovery.

With the configuration, the enable periods having a certain cycle are used to perform the phase synchronization loop processing, thereby obtaining a jitter-less recovered clock signal.

Effects of Invention

According to the present invention, since even when multiple items of specific data are inserted in one cycle of generation period for the enable period, a deviation of an output cycle of the enable period can be eliminated, it is possible to provide a signal generating method for clock recovery capable of reducing jitters occurring in a recovered clock signal CK.

BRIEF DESCRIPTION OF THE DRAWINGS

FIG. 2(a) shows an enable generation cycle EC in which one cycle is sequentially repeated at a cycle timing value of "0, 1, 2, 3, 4", FIG. 2(b) shows a signal for clock recovery ED1 which is formed by alternately generating enable periods EN and disable periods D when a stuff pulse is not detected in a destuff processing, and FIG. 2(c) shows a signal for clock recovery ED2 which is formed by alternately generating the enable periods EN and the disable periods D when a stuff pulse is detected in the destuff processing.

FIG. 3(a) shows a cycle timing of an enable generation cycle EC, FIG. 3(b) shows a signal for clock recovery ED1, FIG. 3(c) shows a signal for clock recovery ED2, FIG. 3(d) shows a count value CT of a frequency dividing counter, and FIG. 3(e) shows a signal for clock recovery ED3.

FIG. 5(a) shows a generation state in step S1, FIG. 5(b) shows a generation state in step S2, and FIG. 5(c) shows a generation state in step S9.

FIG. 6(a) shows a case where disable periods are simply added as before, FIG. 6(b) shows a case where a stuff pulse is detected at the detection position m1, FIG. 6(c) shows a case where a stuff pulse is detected at the detection position m2 after the disable period D11 is generated, FIG. 6(d) shows a case where a stuff pulse is detected at the detection position m3 and the detection position m4 after the disable period D12 is generated, FIG. 6(e) shows a case where a stuff pulse is detected at the detection position m5 after the disable period D13 is generated, FIG. 6(f) shows a case where the disable period D14 is generated, and FIG. 6(g) shows a case where the disable period D15 is generated.

BEST MODE FOR CARRYING OUT THE INVENTION

An embodiment according to the present invention will be described with reference to the accompanying drawings. The embodiment described below is exemplary for the present invention, and the present invention is not limited to the following embodiment. Constituents having the same reference symbol throughout the specification and the drawings are the same.

Figure 4:
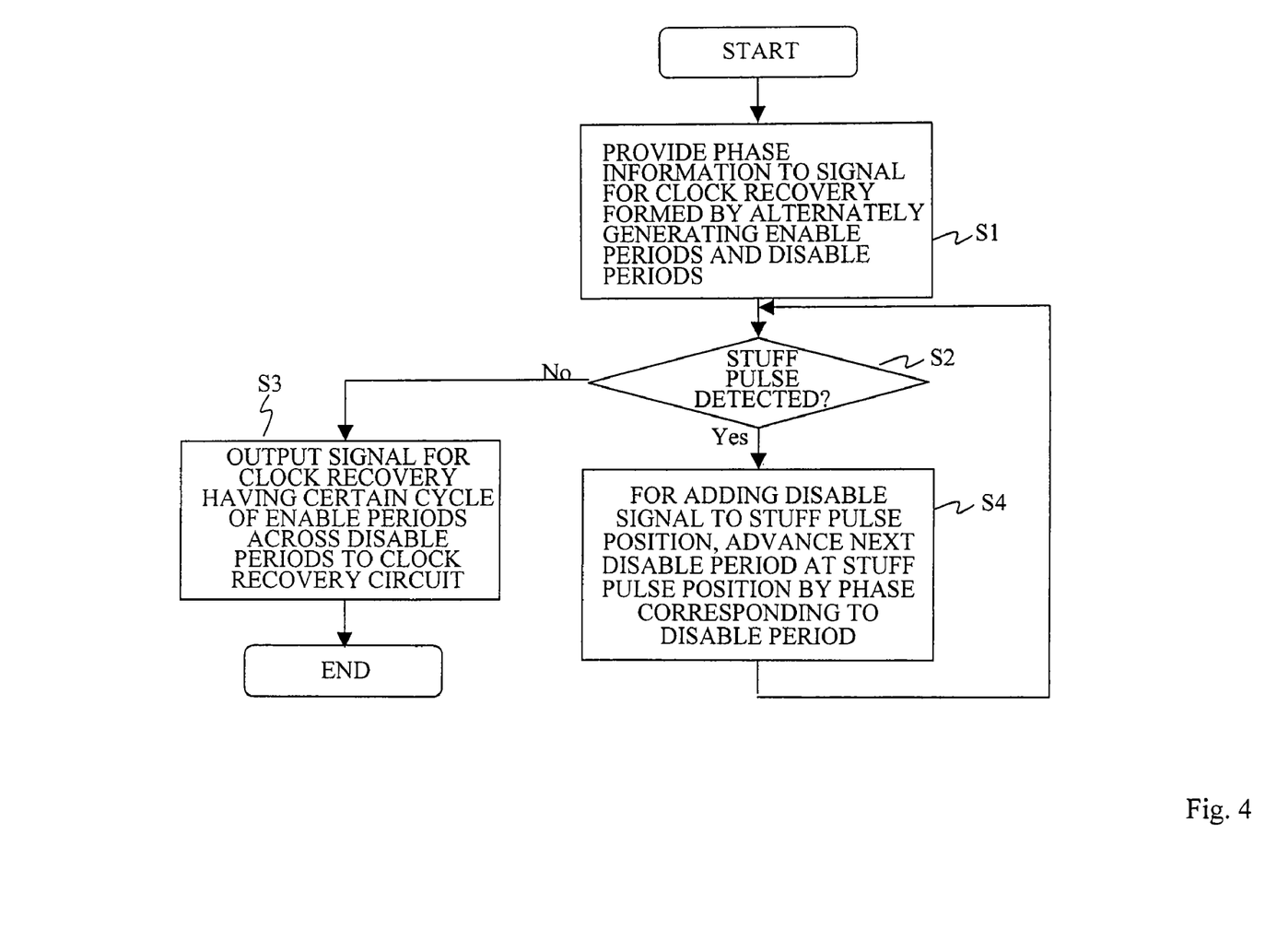
FIG. 4 is a block diagram showing a configuration of a signal generating method for clock recovery according to an embodiment of the present invention.

FIG. 4 is a flowchart for explaining a processing procedure of a signal generating method for clock recovery according to the embodiment of the present invention.

As described above, the signal generating method for clock recovery according to the present embodiment is applied to a demapping processing of extracting client data as the second data of N clocks' (N: positive integer, N<M) in line data from the line data as the first data of M clocks' (M: positive integer) transmitted in a multilayered frame form.

In other words, when a clock signal is recovered from the line data during the demapping, a signal for clock recovery ED, which is formed by alternately generating the enable periods EN having a ratio (N/M) of the N clocks' client data to the M clocks' line data and the disable periods D, is generated. The signal for clock recovery ED is input in a clock recovery circuit 20 shown in FIG. 1, so that a recovered clock signal CK can be obtained.

Figure 5:
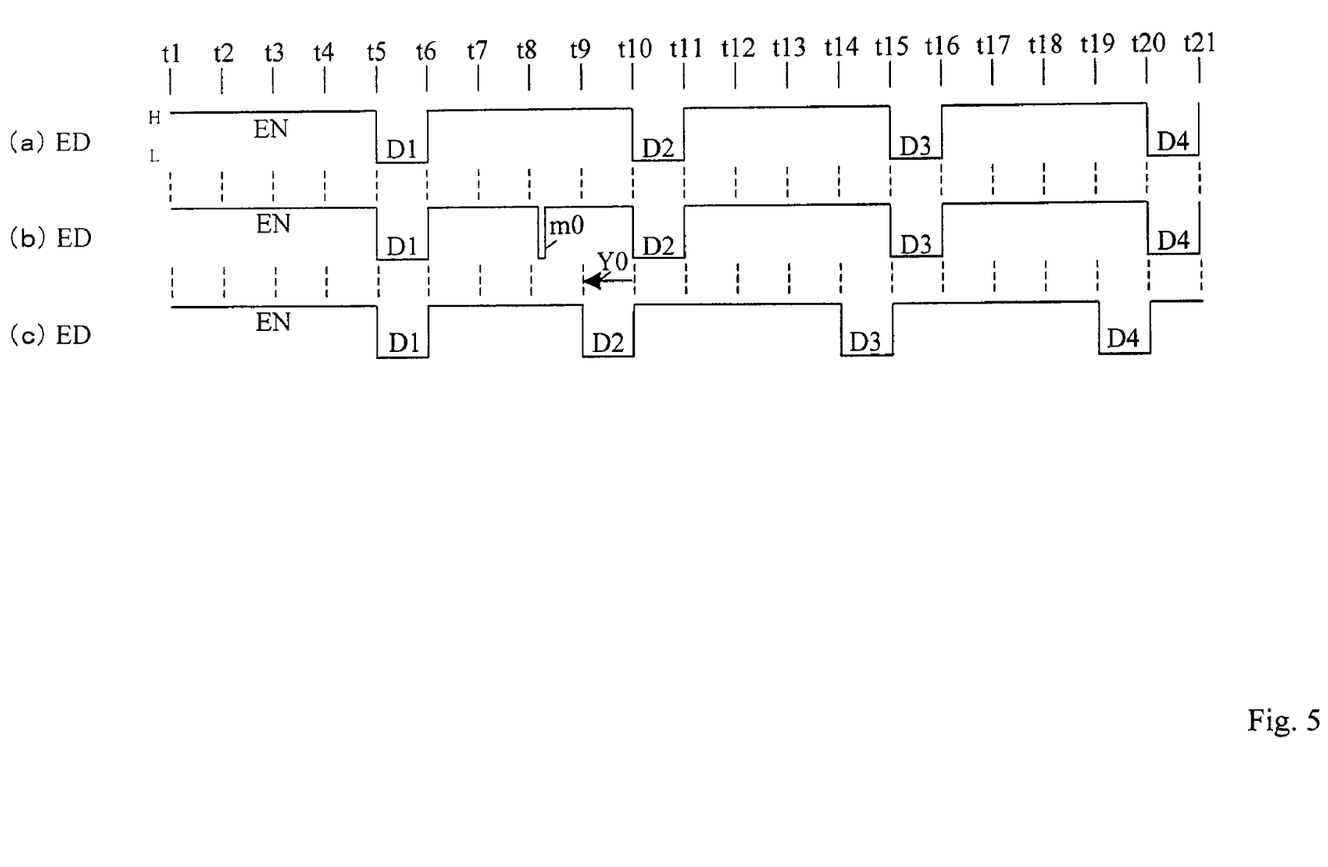
FIG. 5 is a first timing chart showing a generation state of a signal for clock recovery which is formed by alternately generating enable periods and disable periods by the signal generating method for clock recovery according to the embodiment of the present invention, where

In step S1 shown in FIG. 4, as shown in FIG. 5(a), the "H" enable periods EN having signal phase information are generated in a certain cycle having the "L" disable periods D1 to D4 intervened, thereby to generate the signal for clock recovery ED. The phase information is information on signal phases corresponding to times t1 to t21 as clock timings in the line data. Thus, each of the disable periods D1 to D4 is output during a one clock period, and one cycle of enable period EN is output during the four clocks' "H" period. In other words, the four clocks' enable period EN is repeatedly output via the one clock disable period D per five clocks.

Next, in step S2, it is judged as to whether a stuff pulse as specific data inserted in the line data is detected or not during the destuff detection processing. As a result, when not detected, in step S3, the signal for clock recovery ED having a certain cycle of enable periods EN with the disable periods D1 to D4 intervened in above described step S1 is output to the clock recovery circuit 20. Thus, the recovered clock signal CK can be obtained from the clock recovery circuit 20.

On the other hand, when a stuff pulse is detected in above described step S2, in step S4, as the processing of adding a disable period to the detected stuff pulse position, the disable period to be next generated is advanced and generated by a phase corresponding to the disable period during the enable period.

For example, as shown in FIG. 5(b), it is assumed that a stuff pulse is detected at the detection position indicated by the symbol m0 between time t8 and t9 after the disable period D1 is generated during the enable period EN. In this case, the one clock's disable period was conventionally added to the detection position m0. Alternatively, ⅕ disable periods having ⅕ clock width were added for fine adjustment of the enable periods EN.

However, in the present embodiment, the disable period D2 generated after the detection position m0 is advanced and generated by a phase corresponding to the disable period (one clock's period in this example) D1 during the enable period EN as indicated by the arrow Y0 with reference to the phase information. In other words, the disable period D2 between time t10 and t11 in FIG. 5(b) advances to the position at time t9 to t10 as shown in FIG. 5c). In this case, since the disable period D2 advances, the enable periods EN and the disable periods D3 and D4 after the disable period D2 are entirely advanced and generated by one clock's phase. After the generation, the processing returns to step S2 and similarly continues.

Figure 6:
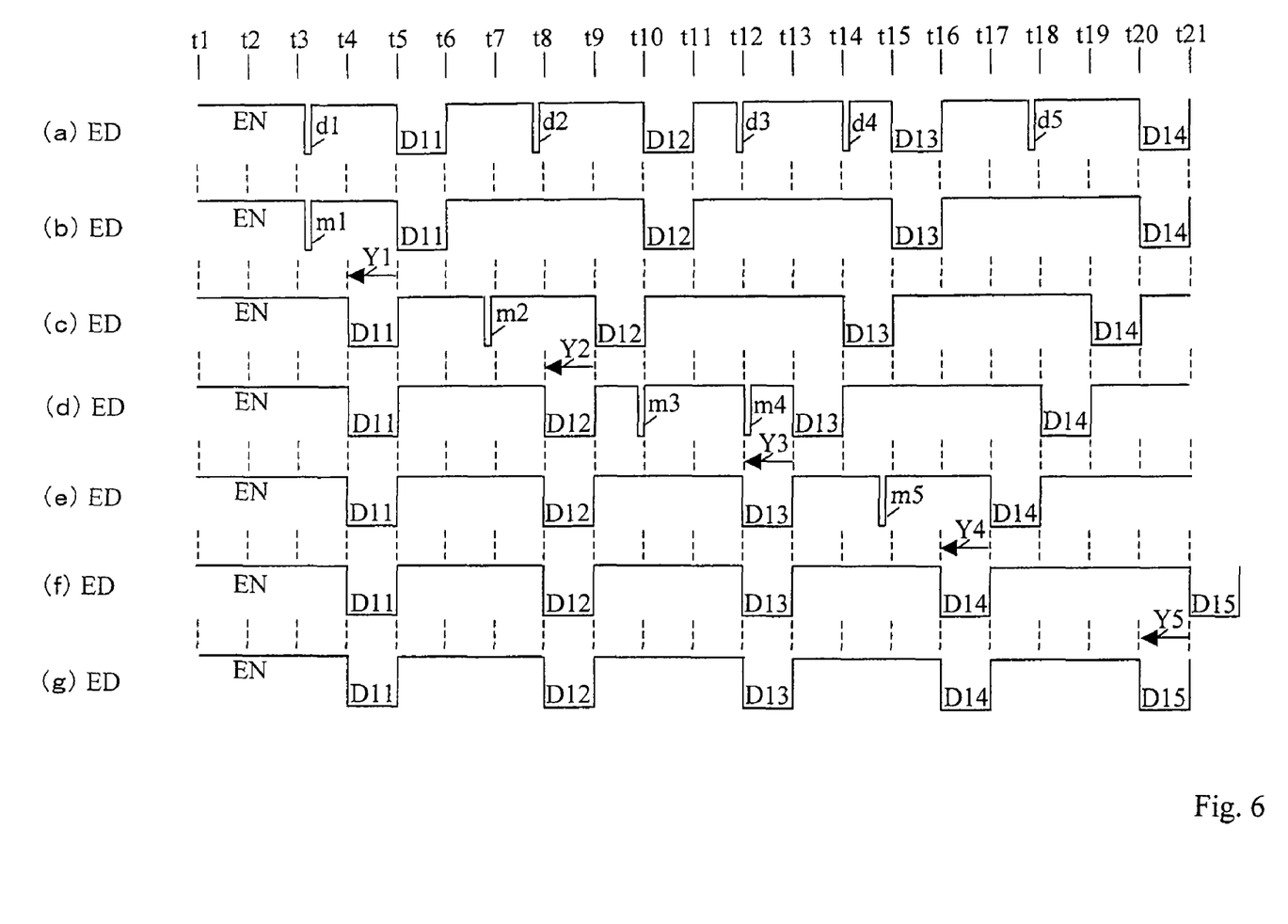
FIG. 6 is a second timing chart showing a generation state of a signal for clock recovery which is formed by alternately generating enable periods and disable periods by the signal generating method for clock recovery according to the embodiment of the present invention, where

Further, the processing of advancing and generating a disable period by a predetermined phase will be described in detail with reference to FIG. 6. As shown by the signal for clock recovery ED of FIG. 6(a), this example corresponds to a case in which ⅕ disable periods are simply added as before as indicated by the "L" pulses d1, d2, d3, d4 and d5 when a stuff pulse is detected five times in the four clock's enable periods EN.

First, as shown in FIG. 6(b), it is assumed that a stuff pulse is detected at the detection position m1 at time t3 to t4 during the enable period EN. The detection position m1 corresponds to the position of the "L" pulse d1.

In this case, the disable period D11 generated after the detection position m1 is advanced and generated by a phase corresponding to the one clock's disable period during the enable period EN as indicated by the arrow Y1 with reference to the phase information. As a result of this process, the disable period D11 between time t5 and t6 in FIG. 6(b) advances to the position at time t4 to t5 as shown in FIG. 6(c). The signal generated subsequent to the disable period D11 is also shifted forward by the one clock's phase.

Next, as shown in FIG. 6(c), it is assumed that a stuff pulse is detected at the detection position m2 between time t6 and t7 after the disable period D11 is generated. In this case, the disable period D12 generated after the detection position m2 is advanced and generated by a phase corresponding to the one clock's disable period D11 as indicated by the arrow Y2 with reference to the phase information. As a result of this process, the disable period D12 between time t9 and t10 in FIG. 6(c) advances to the position at time t8 to t9 as shown in the enable period EN of FIG. 6(d). The signal generated subsequent to the disable period D12 is also shifted forward by the one clock's phase.

Next, as shown in FIG. 6(d), it is assumed that a stuff pulse is detected both at the detection position m3 between time t9 and t10 and at the detection position m4 between time t12 and t13 after the disable period D12 is generated and before the next disable period D13 is generated.

In this case, since a stuff pulse is detected at the two detection positions m3 and m4 during one enable period between the two disable periods, the phase of the disable period is first advanced and generated when a stuff pulse is detected at the earlier detection position m3 and then the phase of the disable period is advanced and generated when a stuff pulse is detected at the later detection position m4.

In other words, the disable period D13 first generated after both the detection positions m3 and m4 is advanced and generated by a phase corresponding to the one clock's disable period D12 as indicated by the arrow Y3 with reference to the phase information when a stuff pulse is detected at the detection position m3. As a result of this process, the disable period D13 between time t13 and t14 in FIG. 6(d) advances to the position between time t12 and t13 as shown in FIG. 6(e). The signal generated subsequent to the disable period D13 is also shifted forward by the one clock's phase.

Next, as shown in FIG. 6(e), the disable period D14 generated after the generation of the disable period D13 is advanced and generated by a phase corresponding to the one-clock disable period D13 as indicated by the arrow Y4 with reference to the phase information when a stuff pulse is detected at the detection position m4. As a result of this process, the disable period D14 between time t17 and t18 in FIG. 6(e) advances to the position between time t16 and t17 as shown in FIG. 6(f). The signal generated subsequent to the disable period D14 is also shifted forward by the one clock's phase.

By the way, after the disable period D13 shown in FIG. 6(e) is generated, a stuff pulse is detected at the detection position m5 between time t14 and t15 before the disable period D14 is generated. However, in this case, since the stuff pulse for promoting to advance and generate the disable period D14 is already detected at the detection position m4, the disable period to be generated by advancing its phase when a stuff pulse is detected at the detection position m5 is to be the disable period D15 subsequent to the disable period D14 shown in FIG. 6(f).

In other words, as shown in FIG. 6(f), the disable period D15 is advanced and generated by a phase corresponding to the one clock's disable period D14 as indicated by the arrow Y5 with reference to the phase information when a stuff pulse is detected at the detection position m5. As a result of this process, the disable period D15 advances to the position between time t20 and t21 as shown in FIG. 6(g). As a result of this process, the three clocks' enable periods EN are repeatedly generated between the one clock's disable periods D11 to D15.

The thus-generated signal for clock recovery ED shown in FIG. 6(g) is output to the clock recovery circuit 20 so that the recovered clock signal CK can be obtained.

As described above, with the signal generating method for clock recovery according to the present embodiment, the disable period D2 is advanced in its phase and generated by a phase corresponding to the disable period (such as one clock's period) D1 during the enable period EN with reference to the phase information on the enable periods when a stuff pulse is detected in the line data indicated by the symbol m0 in FIG. 5(b).

Thus, when the signal for clock recovery ED is generated which is formed by alternately generating the enable periods EN having a ratio (N/M) of the N clock's client data to the M clock's line data and the disable periods D1 to D4, the deviation of the output cycle of the enable period EN can be substantially eliminated as shown in FIG. 5(c). Thereby jitters occurring in the recovered clock signal CK can be reduced.

Conventionally, since the disable period was inserted at the detection position m0 of the stuff pulse shown in FIG. 5(b) in an overwritten manner, a deviation occurred in the output cycle of the enable period and a large jitter occurred in the recovered clock signal CK.

In addition, as shown in FIG. 6(d), the present embodiment is configured such that when a stuff pulse is detected at the two detection positions m3 and m4 after the disable period D12 is generated and before the next disable period D13 is generated, the phase of the disable period D13 to be next generated is advanced and generated as indicated by the arrow Y3 when a stuff pulse is detected at the earlier detection position m3 and then the phase of the disable period D14 to be next generated is advanced and generated as indicated by the arrow Y14 when a stuff pulse is detected at the later detection position m4.

As a result of this process, as shown in FIG. 6(g), the deviation of the output cycle of the enable period EN can be eliminated so that jitters occurring in the recovered clock signal CK can be reduced. In the example of FIG. 6(g) the enable periods EN for 15 clocks are present in 20 clocks between time t1 and t20.

In the enable periods EN generated by the conventional method shown in FIG. 6(a) corresponding to the enable periods EN, the ⅕ disable periods d1 to d5 are simply added at the detection positions of the stuff pulse. Also in this case, the enable periods EN come to 15 clocks out of 20 clocks between time t1 and t20, which is found to be the same as the enable periods EN shown in FIG. 6(g).

Therefore, it can be seen that the enable periods EN for a certain cycle can be generated by the signal generating method for clock recovery according to the present embodiment. In other words, the enable period EN is input into a phase comparator circuit 22 of the clock recovery circuit 20 shown in FIG. 1 so that a less jitter recovered clock signal CK can be obtained.

INDUSTRIAL APPLICABILITY

The signal generating method for clock recovery according to the present invention can be applied to a wavelength multiplexing optical network in 43 Gbit/s channel base capable of transferring information at 40 Gbit/s per wavelength, and the like.

DESCRIPTION OF REFERENCE SYMBOLS

20: Clock recovery circuit
22: Phase comparator circuit
23: LPF
24: VCO
CK: Recovered clock signal
CT: Count value
D, D1 to D5: Disable period
d1 to d5: ⅕ disable period
EC: Output cycle of enable period
EN: Enable period
ED, ED1 to ED3, ED20 to ED26: Signal for clock recovery
m0 to m5: Stuff pulse detection position

What is claimed is:

1. A signal generating method for clock recovery for, in order to recover a clock signal for extracting a second data of N clocks' (N: positive integer, N<M) in a first data of M clocks' (M: positive integer), generating a signal for clock recovery which is formed by alternately generating enable periods having a ratio (N/M) of the second data to the first data and disable periods, and for, when a stuff pulse to be previously inserted in the first data is detected from the first data during the enable period, adding a disable period during the enable period,     wherein phases of the enable period and the disable period are presented to the signal for clock recovery and phase information corresponding to a clock signal included in the first data is provided thereto, and     in order to add a disable period during the enable period, a phase corresponding to the disable period during the enable period is found based on the phase information when the stuff pulse is detected, and a phase of the disable period to be generated after the stuff pulse is detected is advanced by the found phase.

2. The signal generating method for clock recovery according to claim 1, wherein when the multiple items of the stuff pulse are detected during the enable period, a phase corresponding to a disable period during the enable period is found based on the phase information when each item of the stuff pulse specific data is detected, and a phase of one disable period out of the disable periods sequentially generated after the stuff pulse is detected is advanced by the found phase.

3. A clock recovery circuit comprising a phase synchronization loop circuit for using the signal for clock recovery having enable periods and disable periods in an alternate manner, which is generated by the signal generating method for clock recovery according to claim 1, as a phase comparison target for a phase synchronization loop processing to oscillate a clock signal and using the oscillated clock signal as a phase comparison target for the signal for clock recovery.

4. A clock recovery circuit comprising a phase synchronization loop circuit for using the signal for clock recovery having enable periods and disable periods in an alternate manner, which is generated by the signal generating method for clock recovery according to claim 2, as a phase comparison target for a phase synchronization loop processing to oscillate a clock signal and using the oscillated clock signal as a phase comparison target for the signal for clock recovery.

* * * * *